(12) United States Patent
Lautzenhiser

(10) Patent No.: US 6,404,292 B1
(45) Date of Patent: Jun. 11, 2002

(54) VOLTAGE CONTROLLED OSCILLATORS WITH REDUCED INCIDENTAL FREQUENCY MODULATION AND USE IN PHASE LOCKING OSCILLATORS

(75) Inventor: Lloyd L. Lautzenhiser, Nobel (CA)

(73) Assignee: Emhiser Research Ltd., Parry Sound (CA)

( * ) Notice: Subject to any disclaimer, the term of this patent is extended or adjusted under 35 U.S.C. 154(b) by 0 days.

(21) Appl. No.: 09/259,081

(22) Filed: Feb. 26, 1999

Related U.S. Application Data

(63) Continuation-in-part of application No. 09/060,716, filed on Apr. 15, 1998, now abandoned.

(51) Int. Cl.⁷ ............................................... H03B 1/00
(52) U.S. Cl. ......................... 331/17; 331/1 A; 331/175
(58) Field of Search ........................ 331/16, 17, 1 A, 331/175

(56) References Cited

U.S. PATENT DOCUMENTS

| 3,375,462 | A | | 3/1968 | McTaggart |
| 4,736,169 | A | | 4/1988 | Weaver et al. |
| 5,389,899 | A | * | 2/1995 | Yahagi et al. ............... 331/10 |
| 5,446,411 | A | * | 8/1995 | Horsfall et al. ............. 331/11 |
| 5,539,359 | A | | 7/1996 | Goma |
| 5,786,733 | A | | 7/1998 | Yamaguchi |
| 6,023,198 | A | * | 2/2000 | Mc Kinney et al. ......... 331/17 |

* cited by examiner

Primary Examiner—Arnold Kinkead
(74) Attorney, Agent, or Firm—Wendell E. Miller

(57) ABSTRACT

A phase locking oscillator (60, 70, 80, 90, or 110) and a radio frequency oscillator (62, 72, 82, 92, or 112) achieve reduced incidental frequency modulation. A frequency-deviation sensitivity is reduced by a divider (66 or 100) that reduces a frequency-control voltage, thereby decreasing voltage spikes and other electrical noise, and thereby reducing incidental frequency modulation. In embodiments having an AC voltage divider (66), the frequency-control voltage is reduced when a frequency thereof is above a predetermined roll-off frequency. Below the roll-off frequency, the voltage dividing function ceases, and full deviation sensitivity of the radio frequency oscillator (62, 72, or 82) is restored, whereby a capture range of the phase locking oscillator (60, 70, or 80) and a maximum frequency range of the radio frequency oscillator (62, 72, or 82) are restored. Some of the phase locking oscillators (70, 80, 90, or 110) and some embodiments of the radio frequency oscillators (72, 82, 92, or 112) include means (66 or 100) for proportionally combining a supplementary voltage with the reduced frequency-control voltage. Proportionally combining is used in some of the phase locking oscillators (70 or 80) to increase a speed of phase locking. In other embodiments of the phase locking oscillator (90 or 110), proportional combining is used to maintain the capture range. In the phase locking oscillator (90), proportional combining is used to maintain the capture range and to increase the speed of phase locking.

78 Claims, 3 Drawing Sheets

VOLTAGE CONTROLLED OSCILLATORS WITH REDUCED INCIDENTAL FREQUENCY MODULATION AND USE IN PHASE LOCKING OSCILLATORS

CROSS-REFERENCE TO RELATED APPLICATIONS

This application is a Continuation-in-part of U.S. patent application Ser. No. 09/060,716 filed Apr. 15, 1998 now abandoned.

REFERENCE TO "MICROFICHE APPENDIX"

Not Applicable

STATEMENT RE FEDERALLY SPONSORED RESEARCH OR DEVELOPMENT

Not Applicable

BACKGROUND OF THE INVENTION

1. Field of the Invention

The present invention relates generally to voltage controlled oscillators and their use in phase locking oscillators. More particularly, the present invention pertains to voltage controlled oscillators with reduced incidental frequency modulation and their use in phase locking oscillators.

2. Description of the Related Art

As is well known, frequencies in electronic circuits have a tendency to drift. Therefore, phase locking oscillators are used widely to provide electronic circuits that are highly immune to frequency drift. The output frequency is phase locked to a reference frequency that is commonly crystal controlled.

In phase locking oscillators, an edge-triggered phase detector compares a frequency that is fed back from a voltage controlled oscillator (VCO) with a reference frequency, and delivers voltage pulses that are a function of the phase difference between the reference frequency and the feedback frequency to an integrator, or filter.

The integrator integrates the voltage pulses received from the phase detector and then delivers the integrated output to the VCO, driving the VCO away from its free-running frequency and toward phase lock with the reference oscillator. Although it may take several or many cycles, eventually the VCO will lock onto the reference frequency, which is commonly crystal controlled.

While some phase locking oscillators are used to provide a carrier that is not modulated, the output frequencies of phase locking oscillators may be frequency modulated on an AC basis at any frequency that is higher than the natural loop frequency by applying a modulating voltage to the VCO. Alternately, the output frequency of the phase locking oscillator may be DC modulated, or both AC and DC modulated, as taught by Lautzenhiser in U.S. Pat. No. 5,091,706, issued Feb. 25, 1992; U.S. Pat. No. 5,097,230, issued Mar. 17, 1992; and U.S. Pat. No. 5,311,152, issued May 10, 1994.

When a VCO is used in a high performance electronic circuit such as a phase locking oscillator, incidental frequency modulation of the output frequency of the VCO is a critical problem, as will become apparent as this discussion continues.

A basic principle of electronic and electrical design is that any wire conductor or any trace on a circuit board that vibrates through an electrical field will induce a voltage in that wire or trace. And, of course, it is inherent in electronic circuits that there are various electrical fields.

Induced voltages, or noise, or voltage spikes that are superimposed on a voltage driving a voltage controlled oscillator, will cause unwanted modulation of output frequency. This unwanted modulation is called incidental frequency modulation. Incidental frequency modulation (IFM) is a serious problem in high performance electronic circuits.

For instance, if a given voltage controlled oscillator (VCO) has a sensitivity of 20 MHz per volt, an induced voltage of only 1.0 millivolt will cause incidental frequency modulation of 20 kHz. Since 20 kHz is the maximum allowable incidental frequency modulation for many military devices, vibration of a wire conductor or trace leading to a VCO can consume the entire allowable incidental frequency modulation bandwidth.

Of course, every attempt is made to keep wire conductors and traces short, thereby minimizing the problem of incidental frequency modulation. However, often an electrical connection must be made from some relatively distant portion of a circuit board, or even from a separate board.

Voltage controlled oscillators have many uses in addition to being a part of a phase locking loop, and whenever voltage controlled oscillators are used in high performance electronic circuits, incidental frequency modulation is potentially a serious problem.

Reducing the sensitivity (MHz per volt) of the VCO by a factor of ten would reduce incidental frequency modulation caused by induced voltages by the same factor of ten. However, the maximum frequency locking range, or capture range, that could be achieved would also be reduced by a factor of ten, in many applications preventing a phase locking oscillator from phase locking.

In summary, while prior art crystal-controlled phase locking oscillators provide improved frequency stability by minimizing both short term and long term frequency drift, voltage spikes and other electrical noise, whether emanating from the integrator, the lead connecting the integrator to the VCO, or from some other induced voltage, widen the required bandwidth, and make it difficult to manufacture electronic apparatus within military specifications.

BRIEF SUMMARY OF THE INVENTION

Voltage controlled oscillators (VCOs) are provided in which incidental frequency modulation is reduced by a factor up to 10.0 or more. Therefore, phase locking oscillators using VCOs of the present invention also enjoy reduced incidental frequency modulation.

In all embodiments of the present invention, reduction in incidental frequency modulation is reduced by reducing a frequency-deviation sensitivity of the VCO. And, in all embodiments, the VCO includes means for restoring a maximum frequency range and a capture range of the phase locking oscillator.

In several embodiments, the frequency-deviation sensitivity is reduced when a frequency of a frequency-control voltage applied to a VCO is above a predetermined roll-off frequency. And the frequency-deviation sensitivity is increased, or restored, when the VCO is subjected to a frequency-control voltage whose frequency is below the predetermined roll-off frequency. In like manner, the VCO responds at the higher frequency-deviation sensitivity if the frequency-control voltage is a constant DC voltage.

The result is that, when used as a part of a phase locking oscillator, the voltage controlled oscillator responds at the reduced frequency-deviation sensitivity to loop frequencies which are above the predetermined roll-off frequency, and at full frequency-deviation sensitivity to loop frequencies, including DC, which are below the predetermined roll-off frequency.

Therefore, voltage spikes and other electrical noise are attenuated in direct proportion to the reduction in frequency-deviation sensitivity of the VCO, and undesirable incidental frequency modulation caused by the voltage spikes and other electrical noise is attenuated by the same ratio.

While the frequency deviation sensitivity of the voltage controlled oscillator is reduced in response to frequencies above the predetermined roll-off frequency, both the capture range and the frequency response of the phase locking loop remains unaffected.

In two embodiments of the VCOs of the present invention, incidental frequency modulation also is attenuated by reducing a frequency-deviation sensitivity thereof, but a maximum frequency range of the VCO is maintained by means, included in the VCO, for augmenting a frequency-control voltage applied thereto.

Therefore, all of the VCOs of the present invention include means for reducing the frequency-deviation sensitivity, whereby a maximum frequency range is also reduced, and all of the VCOs include means for restoring the maximum frequency range. When used in a phase locking oscillator the means for restoring the maximum frequency range also provides means for restoring a capture range of the phase locking oscillator that was reduced by reducing the frequency-deviation sensitivity of the VCOs.

All components of the VCOs, both for reducing the frequency-deviation sensitivity and for restoring the maximum frequency range thereof, are contained in a shielded can, thereby isolating all of their components from stray voltage fields.

By using VCOs of the present invention in phase locking oscillators, voltage spikes, other electrical noises, AC modulation signals, and incidental frequency modulation are attenuated. This is true for voltage spikes and other electrical noises developed within the phase locked loop, or introduced to the VCO from an external source.

In a first aspect of the present invention, a method is provided for reducing incidental frequency modulation of a voltage controlled oscillator in which an output frequency is driven from a free-running frequency in response to a frequency-control voltage and in proportion to both the frequency-control voltage and a frequency-deviation sensitivity, which method comprises the steps of: reducing the frequency-deviation sensitivity, whereby noise spikes, incidental frequency modulation, and a maximum frequency range for a maximum frequency-control voltage are all reduced; and restoring at least a portion of the reduced maximum frequency range without increasing the maximum frequency-control voltage.

In a second aspect of the present invention, a method is provided for reducing incidental frequency modulation of a phase locking oscillator in which an output frequency phase locks to a reference frequency by comparing a feedback frequency to the reference frequency, producing a frequency-control voltage in response to the comparing step, and controlling the output frequency in response to the frequency-control voltage, which method comprises: reducing a frequency-deviation sensitivity of the output frequency to the frequency-control voltage, whereby noise spikes, incidental frequency modulation, and a capture range are all reduced; and restoring more than one-fourth of the reduced capture range.

In a third aspect of the present invention, a method is provided for reducing incidental frequency modulation of a voltage controlled oscillator in which an output frequency is driven from a free-running frequency in response to a frequency-control voltage and in proportion to both the frequency-control voltage and a frequency-deviation sensitivity, which method comprises the steps of: reducing the frequency-deviation sensitivity to a frequency-control voltage whose frequency is above a predetermined frequency, whereby noise spikes and incidental frequency modulation are reduced; and restoring at least a portion of the reduced frequency-deviation sensitivity in response to a frequency-control voltage whose frequency is below the predetermined frequency.

In a fourth aspect of the present invention, a method is provided for reducing incidental frequency modulation of a phase locking oscillator in which an output frequency phase locks to a reference frequency by comparing a feedback frequency to the reference frequency, producing a frequency-control voltage in response to the comparing step, and controlling the output frequency in response to the frequency-control voltage, which method comprises: reducing a frequency-deviation sensitivity of the output frequency to a frequency-control voltage whose frequency is above a predetermined frequency, whereby noise spikes and incidental frequency modulation are reduced; and restoring more than one-fourth of the reduced frequency-deviation sensitivity in response to a frequency-control voltage whose frequency is below the predetermined frequency.

In a fifth aspect of the present invention, a method is provided for reducing incidental frequency modulation of a voltage controlled oscillator in which an output frequency is driven from a free-running frequency in response to a frequency-control voltage and in proportion to both the frequency-control voltage and a frequency-deviation sensitivity, which method comprises the steps of: reducing the frequency-deviation sensitivity to the frequency-control voltage, whereby noise spikes, incidental frequency modulation, and a maximum frequency range for a maximum frequency-control voltage are reduced; increasing the reduced frequency range; and the increasing step comprises proportionally combining a supplementary voltage and the frequency-control voltage, and controlling the output frequency as a function of the proportionally-combined voltages.

In a sixth aspect of the present invention, a method is provided for reducing incidental frequency modulation of a phase locking oscillator in which an output frequency phase locks to a reference frequency by comparing a feedback frequency to the reference frequency, producing a frequency-control voltage in response to the comparing step, and controlling the output frequency in response to the frequency-control voltage, which method comprises the steps of: dividing the frequency-control voltage, whereby noise spikes, incidental frequency modulation, and a capture range are reduced; increasing the reduced capture range; and the increasing step comprises supplementing the divided frequency-control voltage with a supplementary voltage, and controlling the output frequency as a function of the supplemented frequency-control voltage.

In a seventh aspect of the present invention, a voltage controlled oscillator with reduced incidental frequency modulation is provided that produces a free-running output frequency at an output frequency terminal, and whose output frequency is changed at a predetermined frequency-deviation sensitivity in response to a frequency-control voltage applied to an input voltage terminal, which comprises: means for reducing the frequency-deviation sensitivity, whereby voltage spikes, resultant incidental frequency modulation, and a maximum frequency range for a maximum frequency-control voltage are reduced; and means for restoring at least a portion of the reduced maximum frequency range without the frequency-control voltage exceeding the maximum frequency-control voltage.

In an eighth aspect of the present invention, a phase locking oscillator with reduced incidental frequency modulation is provided which comprises a phase detector, an integrator that produces a frequency-control voltage, and a voltage controlled oscillator that produces an output frequency in response to the frequency-control voltage, which comprises: means for reducing a frequency-deviation sensitivity of the voltage controlled oscillator to the frequency-control voltage, whereby voltage spikes, resultant incidental frequency modulation, and a capture range are all reduced; and means for restoring at least a portion of the reduced capture range.

In a ninth aspect of the present invention, a voltage controlled oscillator with reduced incidental frequency modulation is provided which produces a free-running output frequency at an output frequency terminal, and whose output frequency is changed at a predetermined frequency-deviation sensitivity in response to a frequency-control voltage applied to an input voltage terminal, which comprises: means for reducing the frequency-deviation sensitivity when a frequency of the frequency-control voltage is above a predetermined magnitude, whereby voltage spikes and resultant incidental frequency modulation are reduced; and means for restoring at least a portion of the reduced frequency-deviation sensitivity when the frequency of the frequency-control voltage is below the predetermined magnitude.

In a tenth aspect of the present invention, a phase locking oscillator with reduced incidental frequency modulation is provided which comprises a phase detector, an integrator that produces a frequency-control voltage, and a voltage controlled oscillator that produces an output frequency in response to the frequency-control voltage, which comprises: means for reducing a frequency-deviation sensitivity of the voltage controlled oscillator when a frequency of the frequency-control voltage is above a predetermined magnitude, whereby voltage spikes and resultant incidental frequency modulation are reduced; and means for restoring at least a portion of the reduced frequency-deviation sensitivity when the frequency of the frequency-control voltage is below the predetermined magnitude.

In an eleventh aspect of the present invention, a voltage controlled oscillator with reduced incidental frequency modulation is provided which produces a free-running output frequency at an output frequency terminal, and whose output frequency is changed at a predetermined frequency-deviation sensitivity in response to a frequency-control voltage applied to an input voltage terminal, which comprises: means for reducing the frequency-deviation sensitivity, whereby voltage spikes, a maximum frequency range for a maximum control voltage, and incidental frequency modulation are reduced; means, being interposed intermediate of the input voltage terminal and the output frequency terminal, for increasing the reduced frequency range; and the means for increasing the reduced frequency range comprises means for proportionally combining another voltage with the frequency-control voltage.

In a twelfth aspect of the present invention, a phase locking oscillator with reduced incidental frequency modulation is provided which comprises a phase detector, an integrator that produces a frequency-control voltage, and a voltage controlled oscillator that produces an output frequency in response to the frequency-control voltage, which comprises: means for dividing the frequency-control voltage, whereby a capture range and incidental frequency modulation are reduced; means, being interposed intermediate of an input voltage terminal and an output frequency terminal of the voltage controlled oscillator, for increasing the reduced capture range; and the means for increasing the reduced capture range comprises means for proportionally combining another voltage with the divided frequency-control voltage.

In a thirteenth aspect of the present invention, a method is provided for reducing incidental frequency modulation of a phase locking oscillator, which method comprises: reducing a frequency-deviation sensitivity of the phase locking oscillator in response to frequency-control voltages having frequencies above a predetermined frequency; and restoring at least a portion of the reduced frequency-deviation sensitivity in response to frequency-control voltages having frequencies below the predetermined frequency.

DETAILED DESCRIPTION OF THE INVENTION

Figure 1:
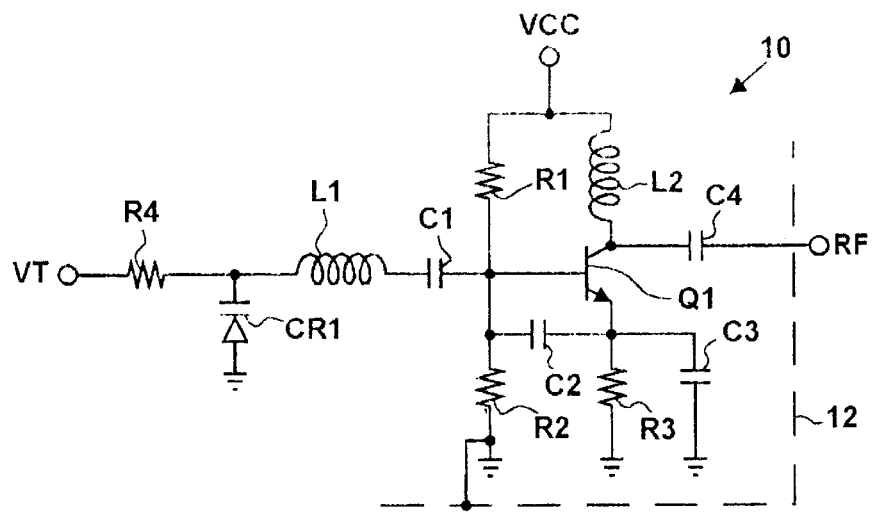
FIG. 1 is a schematic of a prior art voltage controlled oscillator (VCO)

Referring to FIG. 1, a prior art voltage controlled oscillator (VCO), or radio frequency oscillator, 10 includes: a transistor Q1; inductors L1 and L2; resistors R1, R2, and R3; coupling resistor R4; capacitors C1, C2, C3, and C4; and a varactor, or voltage-variable capacitance diode, CR1. Typically, an electrical ground, as shown in FIG. 1, is connected to a shielding can 12 that is symbolically represented by a dashed line, that surrounds the VCO 10, and that protects the VCO 10 from magnetic fields.

Values for these components and a technical explanation for this circuitry may be found in standard text books. However, the principles of the present invention may be practiced using any suitable VCO. As used herein, the VCO 10 represents any suitable VCO or radio frequency oscillator.

Briefly, when a supply voltage is applied to a supply terminal VCC, the VCO 10 provides a free-running radio frequency (RF) output frequency at an output frequency terminal RF. And when a voltage, whether varying or constant, is applied to an input voltage terminal VT, the output frequency at the terminal RF varies from the free-running frequency of the VCO 10.

The RF output frequency of the VCO 10 will change from its free-running frequency in accordance with the sensitivity of the VCO 10 to voltages applied to the input voltage terminal VT. This sensitivity is measured in units of frequency change per unit of input voltage change. That is, the sensitivity of the VCO 10 may be measured in megahertz per volt, and a typical value is 20 megahertz per volt.

Figure 2:
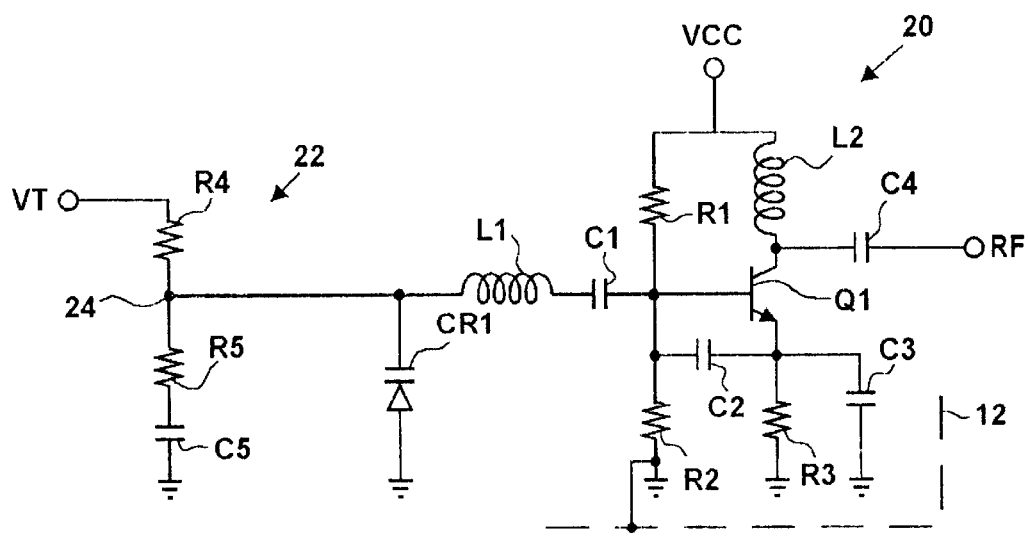
FIG. 2 is a schematic of a first embodiment of a VCO of the present invention that reduces incidental frequency modulation without reducing a maximum frequency range thereof.

Referring now to FIG. 2, in a first embodiment of the present invention, a reduced IFM voltage controlled oscillator (VCO), or variable frequency-deviation-sensitivity voltage controlled oscillator (VCO), or radio frequency oscillator 20 includes the VCO 10 of FIG. 1. In addition, the VCO 20 includes a resistor R5 and a capacitor C5. The resistors R4 and R5 are series connected and cooperate with the capacitor C5 to provide an AC voltage divider 22.

The resistor R4 is connected between the input voltage terminal VT and a rate change node 24, the resistor R5 is connected to the node 24, and the capacitor C5 is connected to the resistor R5 distal from the node 24, and to an electrical ground. The VCO 20, the resistor R4, the resistor R5, and the capacitor C5 are all enclosed in the shielding can 12 as symbolized by dashed lines. And the shielding can 12 is connected to the electrical ground, as shown.

Figure 3:
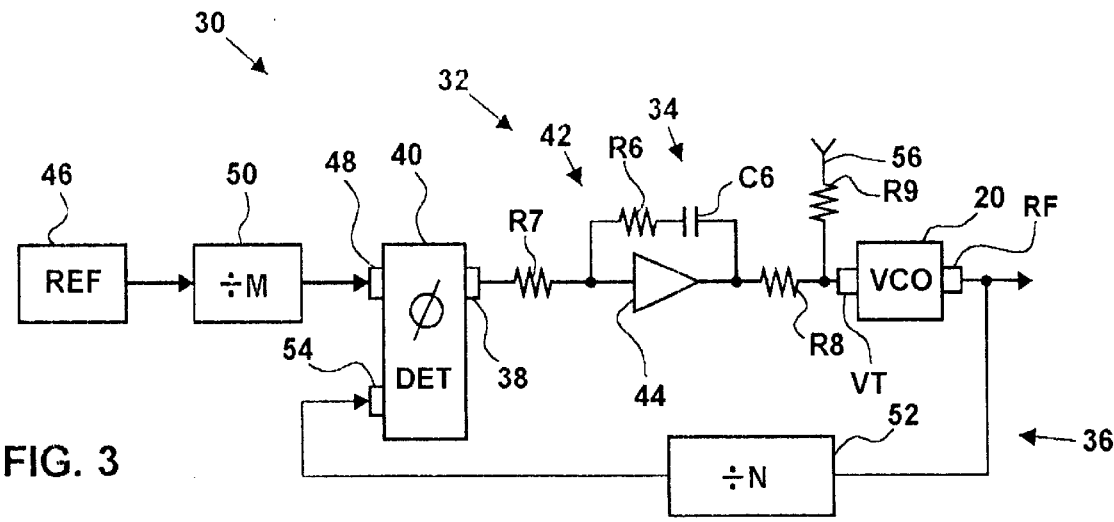
FIG. 3 is a schematic of an embodiment of a reduced IFM phase locking oscillator of the present invention that utilizes the reduced IFM VCO of FIG. 2, but the circuitry of FIG. 3 would be a prior art phase locking oscillator if used with the prior art VCO of FIG. 1.

Referring now to FIG. 3, in a first embodiment, a reduced IFM phase locking oscillator 30 includes the reduced IFM VCO 20 of FIG. 2 that functions with variable frequency-deviation sensitivity. Thus, it could be correct to refer to the apparatus of FIG. 3 as "a phase locking oscillator 30 with a variable frequency-deviation-sensitivity VCO 20." However, if the schematic of FIG. 3 included the VCO 10 of FIG. 1 instead of the VCO 20 of FIG. 2, the phase locking oscillator 30 depicted in FIG. 3 would be a prior art device.

Referring now to FIGS. 2 and 3, the phase locking oscillator 30 of FIG. 3 includes a phase locking loop, or closed loop, 32 with both a forward path 34 and a feedback path 36. The forward path 34 is connected to an output 38 of a phase detector 40. The forward path 34 includes an integrator 42 consisting of an operational amplifier 44, a capacitor C6, and a lead resistor R6. The forward path 34 also includes coupling resistors R7 and R8, and the VCO 20. Connection of the coupling resistor R8 to the VCO 20 is via the input voltage terminal VT of FIGS. 2 and 3; and connection of the VCO 20 to the feedback path 36 is via the output frequency terminal RF of FIGS. 2 and 3.

The phase locking oscillator 30 further includes a crystal-controlled reference oscillator, or reference frequency oscillator, 46 that is connected to an input terminal 48 of the phase detector 40 by a divider 50. The feedback path 36 includes a divider 52 that is connected to an input terminal 54 of the phase detector 40.

The output frequency at the output frequency terminal RF of the VCO 20 is fed back to the phase detector 40 via the divider 52 to the input terminal 54 of the phase detector 40. The phase detector 40 performs a time comparison between the leading edge of the feedback signal and the leading edge of the reference signal that is supplied by the crystal-controlled reference oscillator 46, and supplies this difference pulse to the integrator 42.

The integrator 42 then controls the frequency of the VCO 20 by supplying frequency-control voltages thereto that are in accordance with the integrated time differences between the leading edges of the feedback signal and the reference signal. The result is that the output frequency of the VCO 20 is phase locked to the frequency of the crystal-controlled reference oscillator 46, as divided by the dividers 50 and 52.

If, for instance, the integrator 42 limits the natural loop frequency to 60 Hz, then a modulating signal in excess of 60 Hz that is applied to a modulation resistor R9 will AC modulate the output frequency at the output frequency terminal RF. DC modulation, or AC modulation below 60 Hz, applied to the resistor R9 will be canceled by the phase locking process.

When a frequency correcting voltage is supplied to the input voltage terminal VT of the VCO 20 by the phase detector 40 and the integrator 42, the frequency correcting voltage will start to charge the capacitor C6. Meanwhile, the integrator 42 will ramp to its highest possible output voltage since its bandwidth is approximately thirty times higher than that of the R4, R5, and C5 network of FIG. 2. Once lock is attained, the integrator output will decrease to the level required at the input voltage terminal VT for quiescent lock. Modulation frequencies which are above the frequency determined by R4, R5, and C5 will be attenuated according to the ratio of R4 to R5.

The reduced sensitivity of the VCO 20 will attenuate voltage spikes, other electrical noise, and incidental frequency modulation, perhaps by a factor of 10 or more. But this reduced sensitivity will also reduce phase locking response, and increase phase locking time, by similar ratios.

For instance, with ratios of the resistors R4 and R5 as given above, the frequency correcting voltage will be attenuated by a ratio of 10 to 1. That is, only one-tenth of the frequency correcting voltage will be applied initially to the VCO 20, and phase locking time will be increased accordingly. However, even if it should take hundreds of cycles of the closed loop 32, eventually the capacitor C5 will become charged to the value required to satisfy the loop 32. Therefore, a capture range of the phase locking oscillator 30 will not be reduced.

The phase locking oscillator 30 of FIG. 3 can be used to provide a crystal-controlled and selectably adjustable output frequency for uses such as an unmodulated carrier, and the AC voltage divider 22 of FIG. 2 will attenuate voltage spikes or other electrical noise in accordance with the ratios of the resistors R4 and R5.

If a DC voltage is applied to the input voltage terminal VT from a source that is greatly removed from the VCO 20, and voltage spikes and other electrical noises are induced onto the VCO 20 via a modulation conductor 56 and the modulation resistor R9, the AC voltage divider 22 will attenuate both the electrical noise and the resultant incidental frequency modulation, but will not decrease the megahertz per volt sensitivity to the DC frequency adjusting voltage that is being applied to the modulation conductor 56.

For instance, with the values of the resistors R4 and R5 and the capacitor C5 being 90K ohms, 10K ohms, and 1.0 microfarad, respectively, the roll-off frequency is 1.59 Hz. Therefore, with any frequency-control voltage, or modulating voltage, that has a frequency below 1.59 Hz operation, the VCO 20 will function as described for DC modulation. Thus, the capture range of the loop 32 is unaffected.

Figure 4:
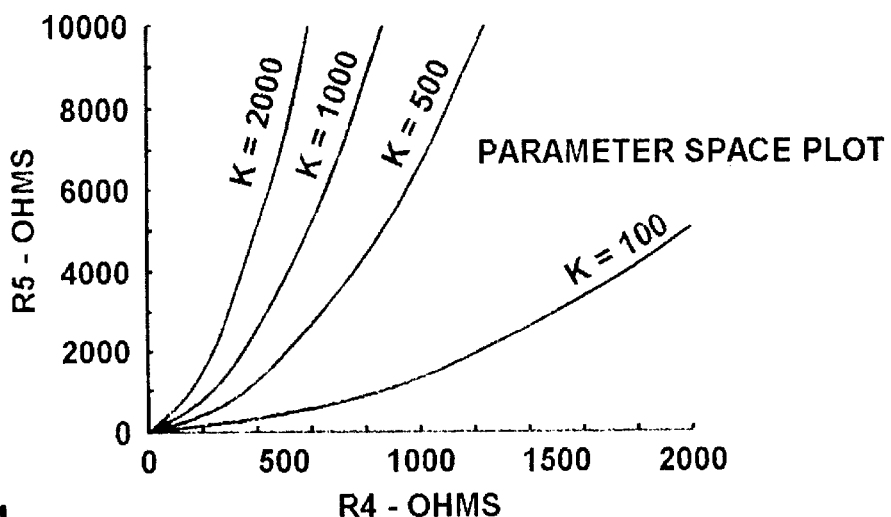
FIG. 4 is a parameter space plot calculated in accordance to the Boundary Crossing Theorem of Frazer and Duncan, showing stable combinations of resistors as a function of VCO gain, with stable combinations of resistors on the left sides of their respective gain curves.

Referring now to FIG. 4, a parameter space plot for the variable frequency-deviation-sensitivity VCO 20 of FIG. 2 was calculated in accordance with the Boundary Crossing Theorem of Frazer and Duncan. This theorem says that, in a family of polynomials, P(s,Q), where Q is a set of uncertain parameters q, the system is stable: if (1) there exists one stable polynomial p(s,q) in P(s,Q); and if (2) P(s,Q) contains no roots on the jω-axis. In the graph of FIG. 4, stable combinations of the resistors R4 and R5 exist to the left sides of respective ones of VCO curves which represent the gain K.

Since stabilities indicated by a parameter space plot, such as the parameter space plot of FIG. 4, are also dependent upon capacitance of the capacitor C5 of FIG. 2, information in FIG. 4 should be considered as an example, and design parameters for a particular design should be determined by calculations as described above, or as discussed below.

Instability can be defined as the point in which phase lock is lost. However, as the frequency of the frequency-control voltage is reduced, a point will be reached, prior to losing phase lock, in which the gain K of the VCO 20 of FIG. 2 will balloon. That is, the gain K will increase before rolling off, and phase lock may be lost as the gain K balloons.

Although parameters may be calculated as noted above, both avoidance of ballooning and providing of stability can be realized by making a pole of the AC voltage divider 22 of FIG. 2 less than one-thirtieth of the pole of the phase locking oscillator 30 of FIG. 3. As an example, if a loop frequency of the phase locking oscillator 30 is 60 Hz, and the roll-off frequency of the AC voltage divider 22 is 1.59 Hz, ballooning will be avoided and the system will be stable.

Figure 5:
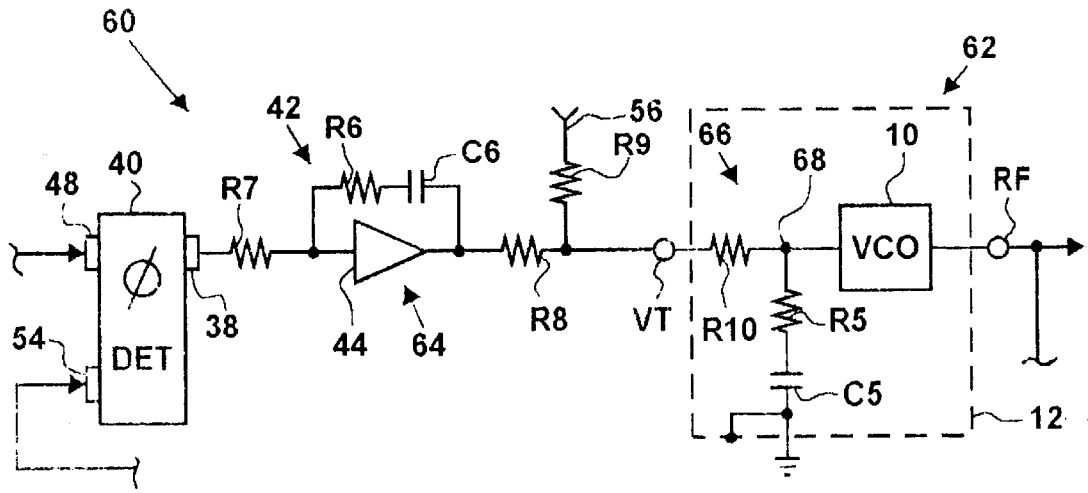
FIG. 5 is a schematic of a variation of the reduced IFM phase locking oscillator of FIG. 3 in which a reduced IFM VCO thereof includes both a standard VCO and an AC voltage divider.

Referring now to FIGS. 2, 3, and 5, a reduced IFM phase locking oscillator 60 of FIG. 5 includes components that are like-numbered and like-named with those in FIGS. 2 and 3, except that the phase locking oscillator 60 includes a reduced IFM voltage controlled oscillator (VCO), or variable frequency-deviation-sensitivity voltage control led oscillator (VCO), or radio frequency oscillator, 62 in a forward path 64, and except as will be discussed.

The reduced IFM VCO 62 includes the VCO 10, which signifies any conventional VCO, the input voltage terminal VT, the output frequency terminal RF, and an AC voltage divider 66. The AC voltage divider 66 includes the resistor R5 and the capacitor C5 as used in the variable frequency-deviation-sensitivity VCO 20 of FIG. 2.

In the variable frequency-deviation-sensitivity VCO 20 of FIG. 2, the AC voltage divider 22 includes the resistor R4, although the resistor R4 is also a part of the prior art VCO 10 of FIG. 1. However, in the variable frequency-deviation-sensitivity VCO 62 of FIG. 5, the AC voltage divider 66 uses a resistor R10, together with the resistor R5 and the capacitor C5. And, the VCO 10 of FIG. 5 includes the resistor R4 as shown in FIG. 1.

It should be apparent to those skilled in the art that, because of the high input impedance of the VCO 10, operation of the VCOs 20 and 62 are substantially identical. It makes little difference whether the AC voltage dividers, such as the AC voltage dividers 22 and 66, include the resistor R4, which is a part of the VCO 10, or another resistor, such as the resistor R10.

Therefore, in any of the voltage dividers of the present invention, such as the voltage divider 66 as shown in FIG. 5, it should be understood that the resistor R10 may be separate from, and in addition to, a coupling resistor that is a part of the VCO 10, such as the resistor R4 of FIG. 1. Or, the resistor R4 of the VCO 10 of FIG. 1 may be used in place of the resistor R10 of the AC voltage divider 66, as shown by the VCO 20 of FIG. 2.

More particularly, in the AC voltage divider 66 of FIG. 5, the resistors, R10 and R5 are series-connected. The series connection is at a rate change node, or reduced frequency-control voltage node, 68. And the rate change node 68 is connected to the VCO 10, so that a reduced frequency-control voltage is applied thereto. The capacitor C5 is series-connected between the resistors, R10 and R5, and a ground, as shown.

The VCO 62 of FIG. 5 and VCOs 72, 82, and 92 of FIGS. 6–9 each include a shielding can 12 that is connected to an electrical ground as shown and described in conjunction with FIGS. 1 and 2, and that encases all of the components recited for the respective ones of the VCOs 62, 72, 82, and 92 of FIGS. 5–9.

Figure 6:
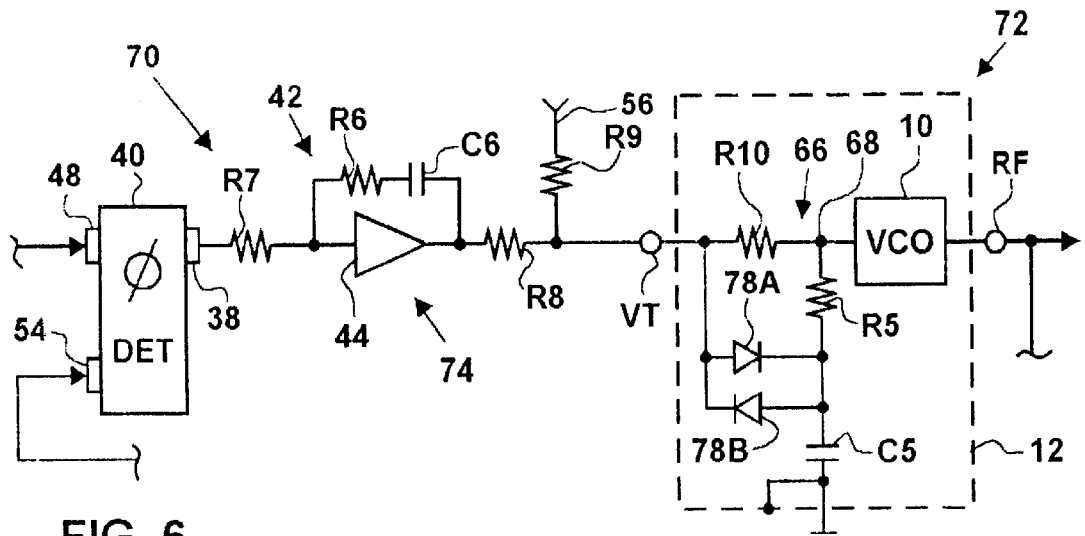
FIG. 6 is a schematic of an embodiment of a reduced IFM phase locking oscillator in which a reduced IFM VCO thereof includes a pair of diodes that increase phase locking speed.

Referring now to FIG. 6, a reduced IFM phase locking oscillator 70 includes components that are like-numbered and like-named with those in FIG. 5, except that the phase locking oscillator 70 includes a reduced IFM voltage controlled oscillator (VCO), variable frequency-deviation-sensitivity voltage controlled oscillator (VCO), or radio frequency oscillator, 72 in a forward path 74 and except as will be discussed.

The reduced IFM VCO 72 includes the VCO 10, the input voltage terminal VT, the output frequency terminal RF, the AC voltage divider 66, and diodes 78A and 78B.

Referring now to FIGS. 5 and 6, in the FIG. 5 embodiment the charge path from the integrator 42 to the capacitor C5 is via the resistor R8, the resistor R10, and the resistor R5. In the steady stage condition, an output voltage of the integrator 42 is the same as a voltage of the capacitor C5. However, at turn-on or channel change, they can differ by several volts.

Referring now to FIG. 6, if the output voltage of the integrator 42 is greater than a charge voltage on the capacitor C5 by more than 0.7 volts, the diode 78A will conduct. Or, if a Schottky diode is used, and this forward voltage difference is more than 0.3 volts, the diode 78A will conduct. When the diode 78A conducts, the charge path from the integrator 42 to the capacitor C5 includes only the resistor R8.

Typical values of the resistors R8, R10, and R5 are 2.2 k ohms, 4.7 k ohms, and 2.2 k ohms, respectively, for a total of 9.1 k ohms. Therefore whenever a forward voltage differential exists that causes the diode 78A to conduct, the phase locking process is speeded by 9.1 k divided by 2.2 k, or approximately four times.

In like manner, when, due to a channel change, a voltage charge of the capacitor C5 is more than 0.7 volts greater than an output of the integrator 42, this reverse voltage differential causes the diode 78B to conduct, thereby increasing the speed of discharge of the capacitor C5 by approximately four times.

However, when either a forward or reverse voltage differential is lower than those which will cause one of the diodes, 78A or 78B, to conduct, the AC voltage divider 66 functions as described in conjunction with FIGS. 2 and 5. That is, the VCO 72 functions at a reduced frequency-deviation sensitivity, thereby attenuating voltage spikes and resultant incidental frequency modulation.

Figure 7:
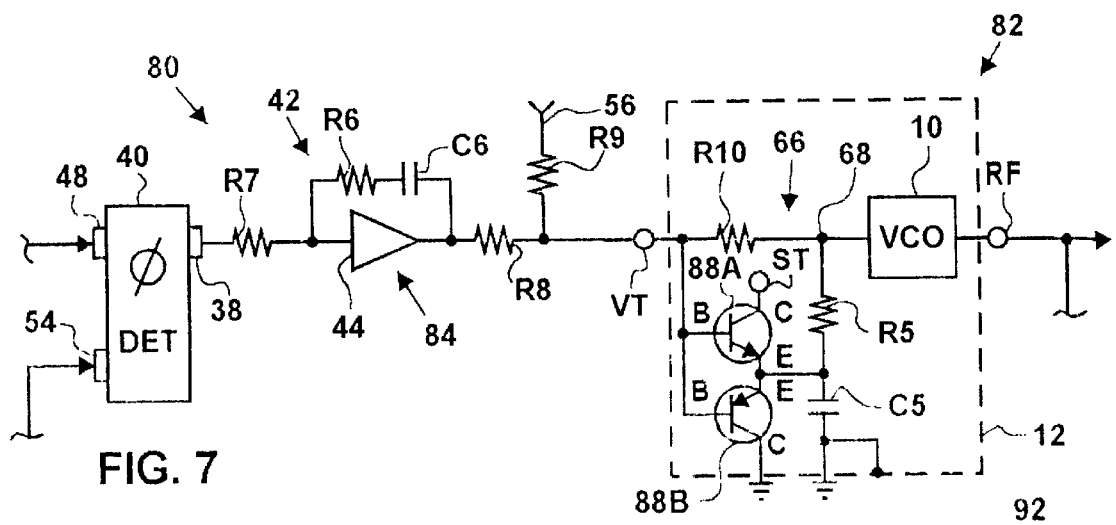
FIG. 7 is a schematic of a preferred embodiment of a reduced IFM phase locking oscillator in which a reduced IFM VCO thereof includes a pair of transistors that increase phase locking speed.

Referring now to FIG. 7, a reduced IFM phase locking oscillator 80 includes components that are like-numbered and like-named with those in FIGS. 5 and 6, except that the phase locking oscillator 80 includes a reduced IFM voltage controlled oscillator (VCO), or variable frequency-deviation-sensitivity voltage controlled oscillator (VCO), or radio frequency oscillator, 82 in a forward path 84 and except as will be discussed.

The reduced IFM VCO 82 includes the VCO 10, the input voltage terminal VT, the output frequency terminal RF, the AC voltage divider 66, an NPN transistor, or active solid state device, 88A, and a PNP transistor, or active solid state device, 88B.

When the integrator 42 produces a frequency-control voltage that exceeds a charge on the capacitor C5, and this forward voltage differential causes a voltage to be applied to a base B of the NPN transistor 88A that is approximately 0.7 volts greater than a voltage placed on an emitter E, the transistor 88A conducts, communicating a voltage source from a supplementary voltage terminal ST to the capacitor C5, greatly increasing both a speed of charging the capacitor C5 and the speed of phase locking.

With values of the resistors R8, R10, and R5 as specified for the FIG. 5 embodiment, and assuming a ratio $\beta$ of collector to base current for the transistor 88A to be 25.0, the increase in phase locking speed provided by the transistor 88A is equal to the total resistance of the resistors R8, R10, and R5, divided by the resistance of the resistor R5, with the quotient multiplied by $\beta=(9.1\div2.2)\times25$=approximately 100.

In like manner, when a charge on the capacitor C5 is greater than a frequency-control voltage generated by the integrator 42, the PNP transistor 88B conducts, discharging the capacitor C5 to a ground faster by approximately 100 times than current would flow through the resistors R5; R10, and R8 back to the integrator 42.

Figure 8:
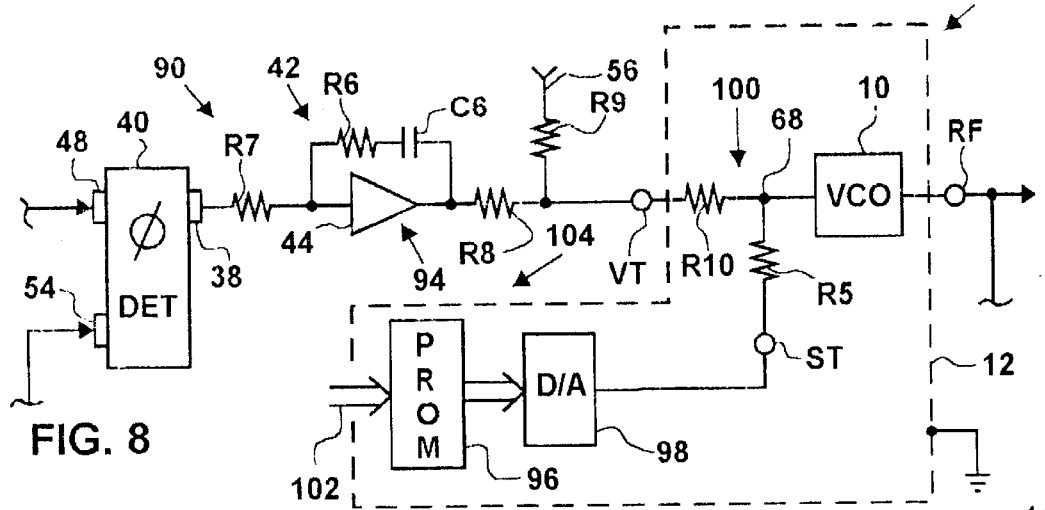
FIG. 8 is a schematic of an embodiment of a reduced IFM phase locking oscillator in which a reduced IFM VCO thereof includes a PROM that provides a channelizing voltage, and resistors that proportionally combine the channelizing voltage with a frequency-control voltage, thereby restoring both a maximum frequency range of the VCO and a capture range of the phase locking oscillator.

Referring now to FIG. 8, a reduced IFM phase locking oscillator 90 includes components that are like-numbered and like-named with those in FIGS. 5, 6, and 7 except that the phase locking oscillator 90 includes a reduced IFM voltage controlled oscillator (VCO), or radio frequency oscillator, 92 in a forward path 94, and except as will be discussed.

The reduced IFM VCO 92 includes the VCO 10, the input voltage terminal VT, the supplementary voltage terminal ST, the output frequency terminal RF, a PROM 96, a D/A converter 98, a voltage divider, or proportional combiner, 100, and a conductor bus 102 for conducting digital commands to the PROM 96.

The proportional combiner 100 includes the resistor R10 and the resistor R5 which are series connected between the input voltage terminal VT and the supplementary voltage terminal ST.

If the resistances of the resistors, R10 and R5, are 4.7 k and 2.2 k, respectively, when the supplementary voltage terminal ST is at ground potential, the VCO 92 functions as a voltage divider, thereby reducing a frequency-control voltage supplied by the integrator 42, and thereby reducing a frequency-deviation sensitivity of the VCO 10 as a function of these resistances, and thereby attenuating both voltage spikes and resultant incidental frequency modulation.

When the PROM 96 and the D/A converter 98 supply a channelizing voltage to the supplementary voltage terminal ST, and this channelizing voltage is insufficient to phase lock the phase locking oscillator 90, the integrator 42 provides whatever magnitude of frequency-control voltage that is required to achieve phase lock.

If resistances of the resistors, R10 and R5, were equal, then the proportional combiner 100 would average the channelizing voltage with the frequency-control voltage, and would apply that average to the VCO 10.

However, the resistance of the resistor R10 is greater than that of the resistor R5. Therefore, voltages applied to the input voltage terminal VT and the supplementary voltage terminal ST are proportionally combined, or proportionally averaged. A voltage applied to the input voltage terminal VT will be reduced more than one-half of the difference between the two voltages, and a voltage applied to the supplementary voltage terminal ST will be reduced less than one-half of the difference between the two voltages.

Because of the dividing, or proportional combining, function of the voltage divider 100, both electrical noise and resultant incidental frequency modulation are reduced. Further, because the PROM 96 and the D/A converter 98 provide a supplementary voltage, that is preferably a channelizing voltage, the maximum capture range of the phase locking oscillator 90 is unattenuated and phase locking is extremely rapid.

Preferably, the PROM 96 is loaded with channelizing information that approximates phase lock for each channel that is to be accessed. Then, when a channelizing selection is transmitted to the PROM 96 by the conductor bus 102, digital information in the PROM 96 is delivered to the D/A converter 98 which will produce a channelizing voltage that almost achieves phase lock without waiting for the integrator 42 to generate the channelizing voltage.

The phase locking oscillator 90 achieves phase lock rapidly, not only because of a means 104 for supplying a supplementary voltage or a channelizing voltage to the supplementary voltage terminal ST, but also because the capacitor C5 of FIGS. 5–7 has been eliminated, thereby obviating the time required to charge and discharge a capacitor, such as the capacitor C5 of FIGS. 5–7. The means 104 for supplying a supplementary voltage includes the PROM 96 and the D/A converter 98.

Figure 9:
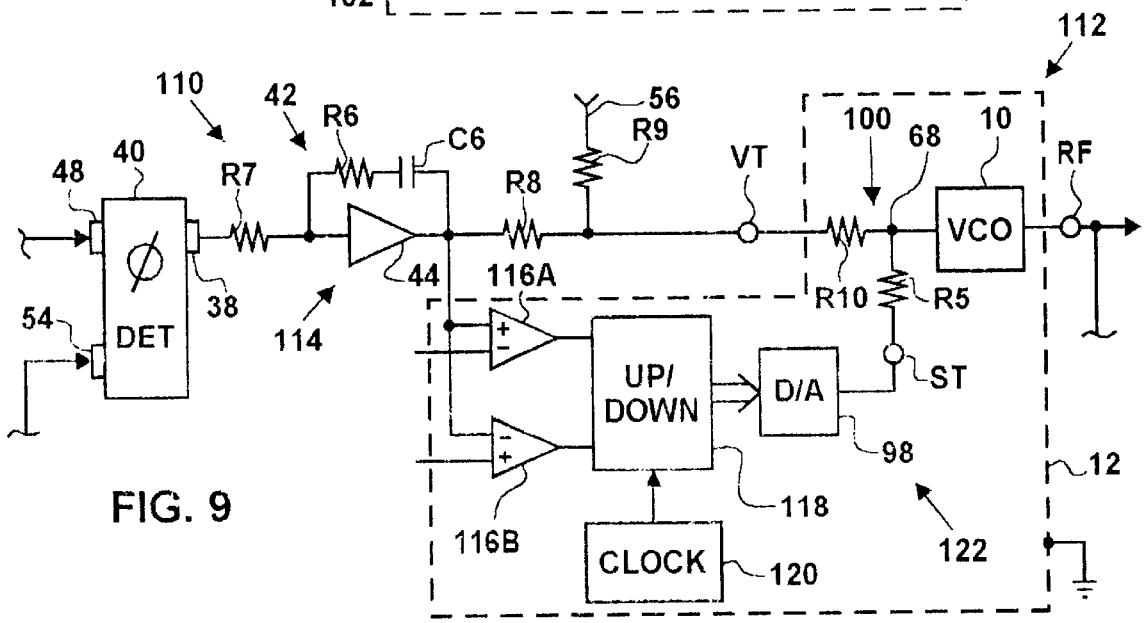
FIG. 9 is a schematic of an embodiment of a reduced IFM phase locking oscillator in which a reduced IFM VCO thereof generates a supplementary voltage and proportionally combines the supplementary voltage with a frequency-control voltage applied to the VCO, thereby restoring a maximum frequency range of the VCO and a capture range of the phase locking oscillator.

Referring now to FIG. 9, a reduced IFM phase locking oscillator 110 includes components that are like-numbered and like-named with those in FIG. 8, except that the phase locking oscillator 110 includes a reduced IFM voltage controlled oscillator (VCO), or radio frequency oscillator, 112 in a forward path 114.

The VCO 112 includes the prior art VCO 10, the proportional combiner 100, an UP comparator 116A, a DOWN comparator 116B, an Up/Down counter 118, a clock 120, and the D/A converter 98. The comparator 116A, the comparator 116B, the Up/Down counter 118, the clock 120, and the D/A converter 98 provide a means 122 for supplementing a frequency-control voltage supplied to the input voltage terminal VT. The supplementing means 122 is a digital integrator whose integration speed depends upon the clock 120.

Selection of a given channel is achieved by selective adjustment of the divider 52 of FIG. 3, thereby changing a frequency fed back to the phase detector 40 of FIGS. 3 and 9. For the following discussion, assume that a frequency-control voltage of the integrator 42 of FIG. 9 is at approximately zero volts, and assume that an output of the D/A converter 98 is zero volts.

As the integrator 42 starts to generate a frequency-control voltage, the frequency-control voltage is proportionally combined with the zero volts of the D/A converter 98. This proportional combining is a function of the resistances of the resistors R10 and R5, thereby resulting in a reduced frequency-deviation sensitivity of the VCO 92.

When the frequency-control voltage reaches a predetermined magnitude, as determined by selective adjustment of the comparator 116A, an UP signal is produced, and the Up/Down counter 118 starts to count. As the count of the Up/Down counter 118 increases, the D/A converter 98 develops a supplementary voltage, and this supplementary voltage is proportionally combined with the frequency-control voltage.

This process continues until phase lock occurs. At phase lock the supplementary voltage will be between limits set by the comparators 116A and 116B.

Therefore, the reduced IFM VCO 112 includes means, comprising the proportional combiner 100, for reducing the frequency-deviation sensitivity of the VCO 10, the means 122 for supplementing the frequency-control voltage, thereby restoring a capture range and a maximum frequency range, and means, comprising the proportional combiner 100, for proportionally combining the two voltages.

As defined herein, a frequency-control voltage is a voltage that is developed by an integrator, such as the integrator 42, although a modulation voltage that is applied to the modulation conductor 56 may also be considered to be a frequency-control voltage. If a frequency-control voltage, or a supplementary voltage, is sufficient in magnitude to approximately phase lock a phase locking oscillator 30, 60, 70, 80, 90, or 110 for a selected channel, then that voltage is a channelizing voltage.

In summary, the present invention provides phase locking oscillators 60, 70, 80, 90, and 110 in which incidental frequency modulation is reduced or attenuated. The means for reducing incidental frequency modulation resides in the VCOs 62, 72, 82, 92, and 112 of the present invention, which are a subcombination of the phase locking oscillators 60, 70, 80, 90, and 110.

More particularly, the VCOs 62, 72, 82, 92, and 112 include means, 66 or 100, for reducing a frequency-deviation sensitivity by reducing a frequency-control voltage, thereby reducing electrical noise and voltage spikes. Reducing noise and/or voltage spikes results in attenuation of incidental frequency modulation. Therefore, it is correct to say that embodiments of the phase locking oscillators 60, 70, 80, 90, and 110, and embodiments of the VCOs 62, 72, 82, 92, and 112 include means for reducing, or attenuating, incidental frequency modulation.

In the VCOs 62, 72, and 82, the means 66 for reducing the frequency-deviation sensitivity is dependent upon a frequency of a frequency-control voltage, and the frequency-deviation sensitivity is reduced when a frequency of the frequency-control voltage is above a predetermined frequency. In contrast, in the VCOs 92 and 112, the reduction of the frequency-deviation sensitivity is continuous.

In the VCOs 62, 72, and 82, the means for reducing the frequency-deviation sensitivity, and incidental frequency modulation, comprises the AC voltage divider 66. In the VCOs 92 and 112, the means for reducing the frequency-deviation sensitivity is the voltage divider, or proportional combiner, 100.

Whether the AC voltage divider 66 or the proportional combiner 100 is used, the means for reducing the frequency-deviation sensitivity includes the series-connected resistors R10 and R5 and includes the VCO 10 being connected at the rate change node 68, of the series-connected resistors R10 and R5, as shown in FIGS. 5–9. The resistors R10 and R5 of the AC voltage divider 66 also function as a means for proportionally combining.

The resistors, R10 and R5, reduce a frequency-control voltage, as developed by the integrator 42, to a reduced frequency-control voltage at the rate change node 68. When reference is made to supplementing the frequency-control voltage, it should be understood to mean supplementing the reduced frequency-control voltage.

As defined herein, a frequency-deviation sensitivity of a VCO is reduced if a capture range, or maximum frequency locking range, has been reduced to one half of a desired frequency locking range. Or, a frequency-deviation sensitivity is reduced if it is necessary to provide means for restoring, or partially restoring, a frequency-deviation sensitivity to restore a desired portion of a reduced capture range of a phase locking oscillator or to restore a desired portion of a maximum frequency range of a voltage controlled oscillator. Or, a frequency-deviation sensitivity is reduced if it is necessary to provide means for supplementing a frequency-control voltage that is supplied to a VCO to restore a desired portion of a reduced capture range of a phase locking oscillator or to restore a desired portion of a reduced maximum frequency range of a voltage controlled oscillator.

In the VCOs 62, 72, and 82, the means for restoring the capture range, or maximum frequency locking range, is means for restoring the frequency-deviation sensitivity of the VCOs 62, 72, and 82. More particularly, in the VCOs 62, 72, and 82, the frequency-deviation sensitivity is restored when a frequency of the frequency-control voltage drops below a predetermined frequency. Further, the means for restoring frequency-deviation sensitivities is the capacitor C5 of the AC voltage divider 66.

In the embodiments of FIGS. 8 and 9, which use the VCOs 92 and 112, respectively, the means for restoring the capture range, or maximum frequency locking range, comprises the means 104 or 122 for supplementing the frequency-control voltage that is supplied by the integrator 42.

In the phase locking oscillator 90 of FIG. 8, the VCO 92 thereof includes means 104 for supplementing the frequency-control voltage, and the means 104 includes the PROM 96 and the D/A converter 98.

In the phase locking oscillator 110 of FIG. 9, the VCO 112 includes the means 122 for supplementing the frequency-control voltage, and the means 122 includes the comparators 116A and 116B, the Up/Down counter 118, the clock 120, and the D/A converter 98.

As disclosed herein, the maximum frequency range of the radio frequency oscillators, 62, 72, 82, 92, and 112 for a maximum frequency control voltage can be fully restored, and a capture range for the phase locking oscillators 60, 70, 80, 90, and 110 can be fully restored. However, in some circumstances, it may be desirable to restore only one-half, or some other portion, of a reduced maximum frequency range and/or a reduced capture range.

In the phase locking oscillators 60, 70, and 80, reducing the frequency-deviation sensitivity of the VCO, 62, 72, or 82, slows phase locking because of inclusion of the capacitor C5 and the time that is required for the integrator 42 to charge the capacitor C5. The VCOs 72 and 82 of FIGS. 6 and 7, respectively, include means for increasing the speed of phase lock.

In the phase locking oscillator 70 of FIG. 6, and the VCO 72 thereof, the means for increasing the speed of phase locking comprises the diodes, 78A and/or 78B, bypassing the resistors R10 and R5 as a function of a forward or reverse voltage differential. Stated another way, the diodes, 78A and 78B, provide means for limiting the reducing of the frequency-deviation sensitivity. The diodes, 78A and 78B, limit the reduction in frequency-deviation sensitivity to voltages below their threshold.

Stated still another way, the diode 78A develops a supplementary voltage, or an other voltage, that is a function of the frequency-control voltage. The resistors R10 and R5 proportionally combine the supplementary voltage with the frequency-control voltage that has been reduced by the resistors, R10 and R5, thereby accelerating changing a charge on the capacitor C5, and thereby increasing the speed of phase locking as a function of a forward voltage differential. Thus, the diode 78A is a means for providing a supplementary voltage, means for increasing current flow into the capacitor C5, means for accelerating changing a charge on the capacitor C5, and means for increasing a speed of phase locking.

In a similar manner, the diode 78B is a means for increasing current flow from the capacitor C5 back to the input voltage terminal VT, and a means for increasing the speed of phase locking by communicating the capacitor C5 back to the integrator 42 as a function of a reverse voltage differential.

In the phase locking oscillator 80 of FIG. 7, the VCO 82 thereof includes means for increasing the speed of phase locking, and this means includes the transistors, 88A and/or 88B.

That is, the transistor 88A provides means for communicating a supplementary voltage, or an other voltage, to the capacitor C5 as a function of the forward voltage differential, thereby increasing current flow to the capacitor C5, and accelerating changing a charge on the capacitor C5 by increasing current flow thereto, thereby providing a means for increasing phase locking speed.

In like manner, the transistor 88B provides means for discharging the capacitor C5 to ground as a function of the reverse voltage differential, thereby providing a means for increasing changing a charge on the capacitor C5, and thereby providing a means for increasing the speed of phase locking.

In the phase locking oscillators, 90 and 110, of FIGS. 8 and 9, and the IFM VCOs, 92 and 112, reducing the frequency-control voltage by the voltage divider 100 results in reducing a maximum frequency range of the voltage controlled oscillator 92 for a maximum frequency-control voltage, and results in reducing a capture range of the phase locking oscillators, 90 and 110.

However, the VCOs 92 and 112 include a means for developing and proportionally combining a supplementary voltage, or an other voltage, with the reduced frequency-control voltage, thereby restoring both the maximum frequency range and the capture range.

In the VCO 92 of FIG. 8, the means for providing a supplementary voltage comprises means 104 for supplementing a frequency-control voltage of the integrator 42 with an other voltage which is preferably a channelizing voltage. In the phase locking oscillator 90, the means 104 for supplying the channelizing voltage includes the PROM 96 and the D/A converter 98. The channelizing voltage, as selected for the desired channel, drives an output frequency of the VCO 92 to approximate phase lock much faster than the integrator 42 can develop a channelizing voltage. That is, the PROM 96 provides means for nonvolatilely storing a preselected voltage, or a channelizing voltage.

In the VCO 112 of FIG. 9, the means for providing a supplementary voltage, or another voltage, comprises means 122 for supplementing the reduced frequency-control voltage with a supplementary voltage that is generated from the frequency-control voltage. This supplementary voltage is developed, or generated, by the comparators, 116A and 116B, the clock 120, the Up/Down counter 118, and the D/A converter 98 when the frequencycontrol voltage is outside either of two predetermined limits set by the comparators, 116A and 116B.

As the frequency-control voltage and the supplementary voltage are proportionally combined by the voltage divider 100, the proportionally-combined voltage reaches a phase locking voltage for a given channel faster than the integrator 42 could develop a frequency-control voltage that would achieve phase lock.

Referring now to FIGS. 5–9, the resistors R10 and R5 provide means for proportionally combining the frequency-control voltage with an other voltage, such as a charge voltage on the capacitor C5, or a supplementing voltage, such as a channelizing voltage. As is well known to those skilled in the art, two voltages may be combined by summing, or otherwise combining. And, two voltages may be summed, or otherwise combined, in direct proportion or in any desired proportion. However, in the present invention, preferably the two voltages are proportionally combined, with the supplementary voltage predominating.

Finally, as taught herein, the diode 78A, the transistor 88A, the PROM 96 with the D/A converter 98 that is included in the means 104, and the Up/Down counter 118 with other components 98, 116A, 116B, 120 that are included in the means 122, all provide means for providing, developing, or generating an other voltage, or a supplementary voltage.

While an attenuation ratio of 10 to 1 has been given as an example for the VCO 20 of FIG. 2, a roll-off frequency of 1.59 Hz has been discussed for the VCO 20, and a loop frequency of 60 Hz has been used as an example, it should be realized that these specifics are merely examples, and that those skilled in the art will be able to develop other variable frequency-deviation-sensitivity VCOs, other phase locking loops using these improved VCOs, and other electrical devices in accordance with apparatus, methods, and principles disclosed herein.

Further, while specific apparatus and methods have been disclosed in the preceding description, and while part numbers have been inserted parenthetically into the claims to facilitate understanding of the claims, it should be understood that these specifics have been given for the purpose of disclosing the principles of the present invention, and that many variations thereof will become apparent to those who are versed in the art. Therefore, the scope of the present invention is to be determined by the appended claims, and without any limitation by the part numbers inserted parenthetically in the claims.

What is claimed is:

1. A method for reducing incidental frequency modulation of a voltage controlled oscillator in which an output frequency is driven from a free-running frequency in response to a frequency-control voltage and in proportion to both said frequency-control voltage and a frequency-deviation sensitivity, which method comprises the steps of:

a) reducing said frequency-deviation sensitivity, whereby noise spikes, incidental frequency modulation, and a maximum frequency range for a maximum frequency-control voltage are all reduced; and b) restoring at least a portion of said reduced maximum frequency range without increasing said maximum frequency-control voltage.

2. A method as claimed in claim 1 in which said method further comprises:

a) proportionally combining another voltage and said frequency-control voltage; and b) controlling said output frequency as a function of said proportionally-combined voltages.

3. A method as claimed in claim 1 in which said method further comprises:

a) comparing a frequency that is proportionate to said output frequency with a reference frequency;

b) generating said frequency-control voltage as a function of said comparing step; and c) phase locking said output frequency to said reference frequency in response to said comparing and generating steps.

4. A method as claimed in claim 1 in which said reducing step comprises reducing said frequency-deviation sensitivity in response to a frequency-control voltage whose frequency exceeds a predetermined frequency.

5. A method as claimed in claim 1 in which said restoring step comprises increasing said frequency-deviation sensitivity in response to a frequency-control voltage whose frequency is below a predetermined frequency.

6. A method as claimed in claim 1 in which said reducing step comprises AC voltage dividing.

7. A method as claimed in claim 1 in which:

a) said reducing step comprises AC voltage dividing; and b) said restoring step comprises obviating said dividing step.

8. A method as claimed in claim 1 in which:

a) said reducing step comprises AC voltage dividing; and b) said AC voltage dividing step comprises the step of changing a charge on a capacitor, whereby a rate of change of said output frequency is reduced by said changing step.

9. A method as claimed in claim 1 in which:

a) said reducing step comprises generating a voltage differential; and b) said method further comprises limiting said reducing step as a function of said voltage differential.

10. A method as claimed in claim 1 in which:

a) said reducing step comprises dividing said frequency-control voltage; and b) said restoring step comprises supplementing said divided frequency-control voltage.

11. A method as claimed in claim 1 in which:

a) said reducing step comprises dividing said frequency-control voltage; and b) said method further comprises supplementing said divided frequency-control voltage.

12. A method as claimed in claim 1 in which:

a) said reducing step comprises dividing said frequency-control voltage;

b) said reducing step comprises generating a voltage differential; and c) said method further comprises supplementing said divided frequency-control voltage as a function of said voltage differential.

13. A method as claimed in claim 1 in which:

a) said reducing step comprises dividing said frequency-control voltage:

b) said method further comprises supplementing said divided frequency-control voltage; and c) said supplementing step comprises developing Up/Down signals, counting said Up/Down signals, and D/A converting.

14. A method as claimed in claim 1 in which:

a) said reducing step comprises dividing said frequency-control voltage; and b) said restoring step comprises supplementing said divided frequency-control voltage with a predetermined voltage.

15. A method as claimed in claim 1 in which:

a) said reducing step comprises dividing said frequency-control voltage;

b) said restoring step comprises supplementing said divided frequency-control voltage; and c) said supplementing step comprises digitally storing a channelizing voltage, recalling said stored channelizing voltage, and D/A converting said recalled channelizing voltage.

16. A method for reducing incidental frequency modulation of a phase locking oscillator in which an output frequency phase locks to a reference frequency by comparing a feedback frequency to said reference frequency, producing a frequency-control voltage in response to said comparing step, and controlling said output frequency in response to said frequency-control voltage, which method comprises the steps of:

a) reducing a frequency-deviation sensitivity of said output frequency to said frequency-control voltage, whereby noise spikes, incidental frequency modulation, and a capture range are all reduced; and b) restoring at least a portion of said reduced capture range.

17. A method as claimed in claim 16 in which said method further comprises:

a) proportionally combining another voltage and said frequency-control voltage; and b) controlling said output frequency as a function of said proportionally-combined voltages.

18. A method for reducing incidental frequency modulation of a voltage controlled oscillator in which an output frequency is driven from a free-running frequency in response to a frequency-control voltage and in proportion to both said frequency-control voltage and a frequency-deviation sensitivity, which method comprises the steps of:

a) reducing said frequency-deviation sensitivity to a frequency-control voltage whose frequency is above a predetermined frequency, whereby noise spikes and incidental frequency modulation are reduced; and b) restoring at least a portion of said reduced frequency-deviation sensitivity in response to a frequency-control voltage whose frequency is below said predetermined frequency.

19. A method as claimed in claim 18 in which:

a) said reducing step comprises the step of AC voltage dividing;

b) said dividing step comprises the step of changing a charge on a capacitor;

c) said changing step comprises generating forward and reverse voltage differentials;

d) said method further comprises increasing a rate of charge of said capacitor as a function of said forward voltage differential; and e) said method still further comprises increasing a rate of discharge of said capacitor as a function of said reverse voltage differential.

20. A method as claimed in claim 18 in which:

a) said reducing step comprises the step of AC voltage dividing;

b) said dividing step comprises the step of changing a charge on a capacitor;

c) said changing step comprises generating a voltage differential; and d) said method further comprises increasing a rate of discharge of said capacitor as a function of said voltage differential.

21. A method as claimed in claim 18 in which:

a) said reducing step comprises the step of AC voltage dividing;

b) said dividing step comprises the step of changing a charge on a capacitor;

c) said changing step comprises generating forward and reverse voltage differentials;

d) said method further comprises proportionally combining another voltage and said frequency-control voltage as a function of said forward voltage differential; and e) said method still further comprises communicating said frequency-control voltage to a ground as a function of said reverse voltage differential.

22. A method for reducing incidental frequency modulation of a phase locking oscillator in which an output frequency phase locks to a reference frequency by comparing a feedback frequency to said reference frequency, producing a frequency-control voltage in response to said comparing step, and controlling said output frequency in response to said frequency-control voltage, which method comprises:

a) reducing a frequency-deviation sensitivity of said output frequency to a frequency-control voltage whose frequency is above a predetermined frequency, whereby noise spikes and incidental frequency modulation are reduced; and b) restoring at least a portion of said reduced frequency-deviation sensitivity in response to a frequency-control voltage whose frequency is below said predetermined frequency.

23. A method for reducing incidental frequency modulation of a voltage controlled oscillator in which an output frequency is driven from a free-running frequency in response to a frequency-control voltage and in proportion to both said frequency-control voltage and a frequency-deviation sensitivity, which method comprises the steps of:

a) reducing said frequency-deviation sensitivity to said frequency-control voltage, whereby noise spikes, incidental frequency modulation, and a maximum frequency range for a maximum frequency-control voltage are reduced;

b) increasing said reduced frequency range; and c) said increasing step comprises proportionally combining a supplementary voltage and said frequency-control voltage, and controlling said output frequency as a function of said proportionally-combined voltages.

24. A method as claimed in claim 23 in which said reducing step comprises voltage dividing.

25. A method as claimed in claim 23 in which said method comprises:

a) developing a voltage differential; and b) providing said supplementary voltage as a function of said voltage differential.

26. A method as claimed in claim 23 in which said method further comprises:

a) storing a plurality of channelizing voltages;

b) recalling a selected one of said channelizing voltages; and c) using said recalled channelizing voltage as said supplementary voltage.

27. A method as claimed in claim 23 in which:

a) said reducing step comprises voltage dividing; and b) said method further comprises comparing said frequency-control voltage with a predetermined voltage, developing pulses, summing said pulses, D/A converting said summed pulses, and using said D/A converted pulses as said supplementary voltage.

28. A method for reducing incidental frequency modulation of a phase locking oscillator in which an output frequency phase locks to a reference frequency by comparing a feedback frequency to said reference frequency, producing a frequency-control voltage in response to said comparing step, and controlling said output frequency in response to said frequency-control voltage, which method comprises the steps of:

a) dividing said frequency-control voltage, whereby noise spikes, incidental frequency modulation, and a capture range are reduced;

b) increasing said reduced capture range; and c) said increasing step comprises supplementing said divided frequency-control voltage with a supplementary voltage, and controlling said output frequency as a function of said supplemented frequency-control voltage.

29. A method as claimed in claim 28 in which said method comprises:

a) storing said supplementary voltage; and b) recalling said supplementary voltage.

30. A voltage controlled oscillator (62, 72, 82, 92, or 112) with reduced incidental frequency modulation which produces a free-running output frequency at an output frequency terminal (RF), and whose output frequency is changed at a predetermined frequency-deviation sensitivity in response to a frequency-control voltage applied to an input voltage terminal (VT), which comprises:

means (66 or 100) for reducing said frequency-deviation sensitivity, whereby voltage spikes, resultant incidental frequency modulation, and a maximum frequency range for a maximum frequency-control voltage are reduced; and means (C5, 104, or 122) for restoring at least a portion of said reduced maximum frequency range without said frequency-control voltage exceeding said maximum frequency-control voltage.

31. A voltage controlled oscillator (72, 82, 92, or 112) as claimed in claim 30 in which:

said voltage controlled oscillator comprises means (66 or 100), being interposed intermediate of said input voltage terminal (VT) and said output frequency terminal (RF), for proportionally combining another voltage with said frequency-control voltage; whereby said output frequency is controlled by said proportionally-combined voltages.

32. A voltage controlled oscillator (62, 72, 82, 92, or 112) as claimed in claim 30 in which said means for reducing said frequency-deviation sensitivity comprises a voltage divider (66 or 100) that is interposed between said input voltage terminal (VT) and said output frequency terminal (RF).

33. A voltage controlled oscillator (62, 72, or 82) as claimed in claim 30 in which said means for reducing said frequency-deviation sensitivity comprises an AC voltage divider (66) that is interposed between said input voltage terminal (VT) and said output frequency terminal (RF).

34. A voltage controlled oscillator (62, 72, or 82) as claimed in claim 30 in which:
    said means for reducing said frequency-deviation sensitivity comprises an AC voltage divider (66) that is interposed between said input voltage terminal (VT) and said output frequency terminal (RF), and that includes a capacitor (C5); and
    said means for restoring comprises said capacitor.

35. A voltage controlled oscillator (72, 82, 92, or 112) as claimed in claim 30 in which said voltage controlled oscillator comprises:
    means (78A, 88A, 104, or 122) for providing a supplementary voltage; and
    means (66 or 100) for proportionally combining said supplementary voltage and said frequency-control voltage; whereby
    said output frequency is controlled by said proportionally-combined voltages.

36. A voltage controlled oscillator (62, 72, or 82) as claimed in claim 30 in which said means for restoring said reduced maximum frequency range comprises means (C5) for at least partially restoring said reduced frequency-deviation sensitivity.

37. A voltage controlled oscillator (92 or 112) as claimed in claim 30 in which said means for restoring said reduced maximum frequency range comprises means (104 or 122) for supplementing said frequency-control voltage.

38. A voltage controlled oscillator (72) as claimed in claim 30 in which:
    said means for reducing said frequency-deviation sensitivity comprises a first resistor (R10) being connected to said input voltage terminal (VT), a capacitor (C5) being connected to a ground, and a second resistor (R5) interconnecting said first resistor and said capacitor;
    said means for restoring comprises said capacitor; and
    said voltage controlled oscillator includes means (78A or 78B) for accelerating-changing a charge on said capacitor as a function of a voltage differential developed by said means for reducing said frequency-deviation sensitivity.

39. A voltage controlled oscillator (72) as claimed in claim 30 in which:
    said means for reducing said frequency-deviation sensitivity comprises a first resistor (R10) being connected to said input voltage terminal (VT), a capacitor (C5) being connected to a ground, and a second resistor (R5) interconnecting said first resistor and said capacitor;
    said means for restoring said maximum frequency range comprises said capacitor;
    said voltage controlled oscillator includes means (78A) for increasing current flow into said capacitor as a function of a voltage differential developed by said means (66) for reducing said frequency-deviation sensitivity; and
    said voltage controlled oscillator further includes means (78B) for increasing current flow from said capacitor as a function of a voltage differential between said capacitor and said frequency-control voltage.

40. A voltage controlled oscillator (82) as claimed in claim 30 in which said voltage controlled oscillator includes means, comprising an active solid state device (88A), for supplementing said frequency-control voltage as a function of a first voltage differential developed by said means (66) for reducing said frequency-deviation sensitivity.

41. A voltage controlled oscillator (82) as claimed in claim 30 in which:
    said means (66) for reducing said frequency-deviation sensitivity comprises a first resistor (R10) being connected to said input voltage terminal (VT), a capacitor (C5) being connected to a ground, and a second resistor (R5) interconnecting said first resistor and said capacitor;
    said means for restoring comprises said capacitor; and
    said voltage controlled oscillator further includes means, comprising an active solid state device (88B), for discharging said capacitor as a function of an opposite voltage differential.

42. A voltage controlled oscillator (92) as claimed in claim 30 in which said means for restoring comprises:
    means, comprising means (96) for storing and a D/A converter (98), for supplying a supplementary voltage; and
    means (100), being operatively connected to said D/A converter and to said input voltage terminal (VT), for proportionally combining said frequency-control voltage and said supplementary voltage.

43. A voltage controlled oscillator (112) as claimed in claim 30 in which said means for restoring comprises means (122), including a counter (118), for generating a supplementary voltage as a function of said frequency-control voltage and another voltage.

44. A phase locking oscillator (60, 70, 80, 90, or 110) with reduced incidental frequency modulation which comprises a phase detector (40), an integrator (42) that produces a frequency-control voltage, and a voltage controlled oscillator (62, 72, 82, 92, or 112) that produces an output frequency in response to said frequency-control voltage, which comprises:
    means (66 or 100) for reducing a frequency-deviation sensitivity of said voltage controlled oscillator to said frequency-control voltage, whereby voltage spikes, resultant incidental frequency modulation, and a capture range are all reduced; and
    means (C5, 104, or 122) for restoring at least a portion of said reduced capture range.

45. A phase locking oscillator (70, 80, 90, or 110) as claimed in claim 44 in which:
    said voltage controlled oscillator (72, 82, 92, or 112) comprises means (66 or 100), being interposed intermediate of an input voltage terminal (VT) and an output frequency terminal (RF), for proportionally combining another voltage with said frequency-control voltage; whereby
    said output frequency is controlled by said proportionally-combined voltages.

46. A phase locking oscillator (70, 80, 90, or 110) as claimed in claim 44 in which said means for restoring comprises:
    means (78A, 88A, 96, or 118) for providing a supplementary voltage; and
    means (66 or 100) for proportionally combining said supplementary voltage with said frequency-control voltage.

47. A voltage controlled oscillator (10) with reduced incidental frequency modulation which produces a free-running output frequency at an output frequency terminal (RF), and whose output frequency is changed at a predetermined frequency-deviation sensitivity in response to a frequency-control voltage applied to an input voltage terminal (VT), which comprises:

means (66) for reducing said frequency-deviation sensitivity when a frequency of said frequency-control voltage is above a predetermined magnitude, whereby voltage spikes and resultant incidental frequency modulation are reduced; and means (C5) for restoring at least a portion of said reduced frequency-deviation sensitivity when said frequency of said frequency-control voltage is below said predetermined magnitude.

48. A voltage controlled oscillator (72 or 82) as claimed in claim 47 in which said voltage controlled oscillator further comprises means (66), being interposed between said input voltage terminal (VT) and said output frequency terminal (RF), for proportionally combining another voltage with said frequency-control voltage, whereby said output frequency is controlled by said proportionally-combined voltages.

49. A phase locking oscillator with reduced incidental frequency modulation which comprises a phase detector (40), an integrator (42) that produces a frequency-control voltage, and a voltage controlled oscillator (62, 72, or 82) that produces an output frequency in response to said frequency-control voltage, which comprises:

means (66) for reducing a frequency-deviation sensitivity of said voltage controlled oscillator when a frequency of said frequency-control voltage is above a predetermined magnitude, whereby voltage spikes and resultant incidental frequency modulation are reduced; and means (C5) for restoring at least a portion of said reduced frequency-deviation sensitivity when said frequency of said frequency-control voltage is below said predetermined magnitude.

50. A phase locking oscillator (70 or 80) as claimed in claim 49 in which said voltage controlled oscillator (72 or 82) comprises:

means (78A or 88A) for providing a supplementary voltage; and means (66) for proportionally combining said supplementary voltage with said frequency-control voltage; whereby said output frequency is controlled by said proportionally-combined voltages.

51. A voltage controlled oscillator (10) with reduced incidental frequency modulation which produces a free-running output frequency at an output frequency terminal (RF), and whose output frequency is changed at a predetermined frequency-deviation sensitivity in response to a frequency-control voltage applied to an input voltage terminal (VT), which comprises:

means (66 or 100) for reducing said frequency-deviation sensitivity, whereby voltage spikes, a maximum frequency range for a maximum control voltage, and incidental frequency modulation are reduced;

means (78A, 88A, 92, or 112), being interposed intermediate of said input voltage terminal and said output frequency terminal, for increasing said reduced frequency range; and said means (66 or 100) for increasing said reduced frequency range comprises means for proportionally combining another voltage with said frequency-control voltage.

52. A phase locking oscillator with reduced incidental frequency modulation which comprises a phase detector (40), an integrator (42) that produces a frequency-control voltage, and a voltage controlled oscillator (72, 82, 92, or 112) that produces an output frequency in response to said frequency-control voltage, which comprises:

means (66 or 100) for dividing said frequency-control voltage, whereby a capture range and incidental frequency modulation are reduced;

means (78A, 88A, 92, or 112), being interposed intermediate of an input voltage terminal (VT) and an output frequency terminal (RF) of said voltage controlled oscillator, for increasing said reduced capture range; and said means (66 or 100) for increasing said reduced capture range comprises means for proportionally combining another voltage with said divided frequency-control voltage.

53. A method for reducing incidental frequency modulation of a phase locking oscillator, which method comprises:

a) reducing a frequency-deviation sensitivity of said phase locking oscillator in response to frequency-control voltages having frequencies above a predetermined frequency; and b) restoring at least a portion of said reduced frequency-deviation sensitivity in response to frequency-control voltages having frequencies below said predetermined frequency.

54. A method as claimed in claim 1 in which said reducing step comprises reducing said frequency-control voltage.

55. A method as claimed in claim 1 in which:

said reducing step comprises reducing said frequency-control voltage; and said restoring step comprises at least partially restoring said reduced frequency-control voltage.

56. A method as claimed in claim 1 in which said reducing step comprises dividing said frequency-control voltage.

57. A method as claimed in claim 1 in which:

a) said reducing step comprises dividing said frequency-control voltage; and b) said restoring step comprises at least partially obviating said dividing step.

58. A method as claimed in claim 1 in which said restoring step comprises performing said restoring step irrespective of a frequency of said frequency-control voltage.

59. A method as claimed in claim 16 in which said reducing step comprises dividing said frequency-control voltage.

60. A method as claimed in claim 16 in which said reducing step comprises AC voltage dividing.

61. A method as claimed in claim 16 in which said reducing step comprises reducing said frequency-deviation sensitivity in response to a frequency-control voltage whose frequency exceeds a predetermined frequency.

62. A method as claimed in claim 16 in which said restoring step comprises increasing said frequency-deviation sensitivity in response to a frequency-control voltage whose frequency is below a predetermined frequency.

63. A method as claimed in claim 16 in which:

a) said reducing step comprises AC voltage dividing; and b) said restoring step comprises obviating said dividing step.

64. A method as claimed in claim 16 in which:

a) said reducing step comprises dividing said frequency-control voltage; and b) said method further comprises supplementing said divided frequency-control voltage.

65. A method as claimed in claim 16 in which:
a) said reducing step comprises dividing said frequency-control voltage;
b) said restoring step comprises supplementing said frequency-control voltage; and
c) said supplementing step comprises digitally storing a voltage, recalling said stored voltage, and D/A converting said recalled voltage.

66. A method as claimed in claim 16 in which:
a) said reducing step comprises dividing said frequency-control voltage;
b) said method further comprises supplementing said divided frequency-control voltage; and
said supplementing step comprises developing Up/Down signals, counting said Up/Down signals, and D/A converting.

67. A method as claimed in claim 16 in which said restoring step comprises performing said restoring step irrespective of a frequency of said frequency-control voltage.

68. A method as claimed in claim 18 in which:
a) said reducing step comprises the step of AC voltage dividing;
b) said dividing step comprises the step of changing a charge on a capacitor;
c) said changing step comprises generating forward and reverse voltage differentials;
d) said method further comprises increasing a rate of charge of said capacitor as a function of said forward voltage differential.

69. A phase locking oscillator (60, 70, 80, 90, or 110) as claimed in claim 44 in which said voltage controlled oscillator (62, 72, 82, 92, or 112) comprises an input voltage terminal (VT) and an output frequency terminal (RF); and said means for reducing said frequency-deviation sensitivity comprises a voltage divider (66 or 100) that is interposed between said input voltage terminal and said output frequency terminal.

70. A phase locking oscillator (60, 70, or 80) as claimed in claim 44 in which:
said voltage controlled oscillator (62, 72, or 82) includes an input voltage terminal (VT) and an output frequency terminal (RF); and
said means for reducing said frequency-deviation sensitivity comprises an AC voltage divider (66) that is interposed between said input voltage terminal and said output frequency terminal.

71. A phase locking oscillator (60, 70, or 80) as claimed in claim 44 in which:
said voltage controlled oscillator (62, 72, or 82) includes an input voltage terminal (VT) and an output frequency terminal (RF);
said means for reducing said frequency-deviation sensitivity comprises an AC voltage divider (66) that is interposed between said input voltage terminal and said output frequency terminal, and that includes a capacitor (C5); and
said means for restoring comprises said capacitor.

72. A phase locking oscillator (70 or 80) as claimed in claim 44 in which:

said means for reducing said frequency-deviation sensitivity comprises a first resistor (R10) being connected to said input voltage terminal (VT) of said voltage controlled oscillator (72 or 82), a capacitor (C5) being connected to a ground, and a second resistor (R5) interconnecting said first resistor and said capacitor;
said means for restoring comprises said capacitor; and
said voltage controlled oscillator includes means (78A, 78B, 88A, or 88B) for accelerating changing a charge on said capacitor as a function of a voltage differential developed by said means for reducing said frequency deviation sensitivity.

73. A phase locking oscillator (80) as claimed in claim 44 in which said voltage controlled oscillator (82) includes means, comprising an active solid state device (88A), for supplementing said frequency-control voltage as a function of a first voltage differential developed by said means (66) for reducing said frequency-deviation sensitivity.

74. A phase locking oscillator (80) as claimed in claim 44 in which:
said means (66) for reducing said frequency-deviation sensitivity comprises a first resistor (R10) being connected to said input voltage terminal (VT) of said voltage controlled oscillator (82), a capacitor (C5) being connected to a ground, and a second resistor (R5) interconnecting said first resistor and said capacitor;
said means for restoring comprises said capacitor; and
said voltage controlled oscillator includes means, comprising an active solid state device (88B), for discharging said capacitor to a ground as a function of a voltage differential that is developed by said means for reducing.

75. A phase locking oscillator (90) as claimed in claim 44 in which said phase locking oscillator further comprises:
means, comprising means (96) for storing, and a D/A converter (98), for supplying a supplementary voltage; and
means (100), being operatively connected to said D/A converter and to said input voltage terminal (VT), for proportionally combining said frequency-control voltage and said supplementary voltage.

76. A phase locking oscillator (110) as claimed in claim 44 in which said means for restoring includes means (122), comprising a counter (118), for generating a supplementary voltage as a function of said frequency-control voltage and another voltage.

77. A voltage controlled oscillator (92) as claimed in claim 51 in which said voltage controlled oscillator further comprises:
means (96) for digitally storing said another voltage;
means (96) for recalling said another voltage; and
means (98) for D/A converting said another voltage.

78. A phase locking oscillator (90) as claimed in claim 52 in which:
said another voltage comprises a channelizing voltage; and
said phase locking oscillator further comprises means (96) for digitally storing said channelizing voltage, means (96) for recalling said channelizing voltage; and means (98) for D/A converting said channelizing voltage.

\* \* \* \* \*